United States Patent [19]
Goldstein et al.

[11] Patent Number: 5,712,864
[45] Date of Patent: Jan. 27, 1998

[54] PHOTONIC DIPLEX TRANSCEIVER

[75] Inventors: Léon Goldstein, Chaville; Jean-Louis Gentner, Gif sur Yvette; François Brillouet, Sevres, all of France

[73] Assignee: Alcatel N.V., Rijswijk, Netherlands

[21] Appl. No.: 616,382

[22] Filed: Mar. 15, 1996

[30] Foreign Application Priority Data

Mar. 16, 1995 [FR] France ................... 95 03057

[51] Int. Cl.⁶ ............... H01S 3/19; H01S 3/10; H01S 3/08; H04B 10/24
[52] U.S. Cl. .................. 372/50; 372/26; 372/96; 359/113; 359/114; 359/152
[58] Field of Search ............ 372/50, 26, 96; 385/14; 359/113, 114, 152

[56] References Cited

U.S. PATENT DOCUMENTS

| | | | |
|---|---|---|---|
| 5,031,188 | 7/1991 | Koch et al. | 372/50 |
| 5,060,235 | 10/1991 | Ikeda | 372/50 |
| 5,144,637 | 9/1992 | Koch et al. | 372/50 |
| 5,170,402 | 12/1992 | Ogita et al. | 372/26 |
| 5,274,649 | 12/1993 | Hirayama et al. | 372/50 |

FOREIGN PATENT DOCUMENTS 243 720  11/1991  United Kingdom .

OTHER PUBLICATIONS

M. Gibbon et al, "High–Speed Electroabsorption Modulator Monolithically Integrated with a 2X/8 DFB Laser and Back Monitor by Selective Area MPVPE" *Proceedings Of European Conference On Optical Communication*(EC, Montreux, Sep. 12–16, 1993, vol. 2, Sep. 12, 1993, Electrotechnical Association, pp. 325–328, XP 000492232.

Z.M. Chuang et al, "Photonic Initegrated Tunable Receivers with Optical Preamplifiers for Direct Dection", *Applied Physics Letters*, vol. 63, No. 7, 16 Aug. 1993, New York, US, pp. 880–882, XP 000388128.

*Primary Examiner*—Rodney B. Bovernick
*Assistant Examiner*—Luong-Quyen T. Phan
*Attorney, Agent, or Firm*—Sughrue, Mion, Zinn, Macpeak & Seas, PLLC

[57] ABSTRACT

A semiconductor photonic diplex transceiver includes a laser to generate a first optical signal having a certain wavelength and a photodetector to detect a second optical signal having another wavelength. The diplex transceiver also includes an absorber of the first signal disposed between the laser and the detector which form integral parts of an optical waveguide. The laser generates the first signal in the form of a continuous wave and is disposed between the absorber and a selective modulator of the first signal. This reduces the problems of optical and electrical crosstalk between the transmit and receive functions. Applications include user premises optical fiber transmit/receive equipments.

14 Claims, 1 Drawing Sheet

PHOTONIC DIPLEX TRANSCEIVER

BACKGROUND OF THE INVENTION

1. Field of the Invention

The invention concerns a photonic semiconductor device, to be more specific, a diplex transceiver used as a transmitter and receiver in an optical signal communication system.

The invention applies among other things to user premises optical fiber transmit/receive equipment.

2. Description of the prior art

Wavelength division multiplexing (WDM) enables simultaneous bidirectional communication on a single optical fiber of an optical communication system or multichannel communications on a single optical fiber.

In the case of a bidirectional communication on a single optical fiber, a first optical signal is received at a certain wavelength and a second optical signal is transmitted at another wavelength within an integrated semiconductor device.

A semiconductor device integrating the various optical functions on the same substrate to transmit a first optical signal at a certain wavelength, for example 1.3 µm, and to receive a second optical signal at another wavelength, for example 1.55 µm, has already been envisioned.

Consideration was first given to guided optics on an InP (indium phosphide) substrate incorporating a function to separate optical signals with different wavelengths by demultiplexing them onto two different paths, using a wavelength selective coupler or an interferometer, for example.

In practise this solution is found to be totally unsuitable for use in consumer grade user premises optical fiber transmit/receive equipment since it is complex and costly to implement. Also, it is extremely difficult to make the demultiplexer independent of the polarization of the light conveyed in the component.

The semiconductor diplex transceiver disclosed in documents GB 2,243,720, U.S. Pat. No. 5,031,188 and U.S. Pat. No. 5,144,637 solves the problems stated above.

This device, shown highly schematically in FIG. 1, includes a laser 10 which generates a first optical signal at a first wavelength (1.3 µm in this example) and a photodetector 11 which detects a second optical signal at a second wavelength (1.55 µm in this example). The laser 10 and the photodetector 11 are integrated into a common optical waveguide structure 12 with an inline absorber 13 that is selective at the wavelength of the first signal (1.3 µm in this example) and disposed between the laser and the photodetector along a longitudinal axis of the optical waveguide structure 12.

The selective absorber 13 isolates the transmit function and the receive function by preventing the optical signal at the first wavelength propagating towards the photodetector. The first optical signal generated by the laser 10 tends to propagate along the longitudinal axis of the waveguide structure, in both directions indicated by arrows in FIG. 1.

In this prior art semiconductor diplex transceiver the laser 10 is excited by an alternating current potential AC(+) in order to modulate the first optical signal with digital data to be transmitted.

Conversely, the photodetector 11 is negative biased. When it is excited by the modulated second optical signal, an alternating current is recovered representative of digital data coded in the second signal.

It is relatively simple to integrate optically the three functions implemented by the modulator laser, the photodetector and the absorber, in particular using conventional semiconductor heterostructure growth techniques. The final structure obtained is only slightly dependent on the polarization of the light conveyed in the optical waveguide.

Nevertheless, since the absorber 13 is not a perfect isolator it allows some of the first optical signal generated by the laser 10 to pass towards the photodetector. Because the first optical signal is modulated by the digital data, it causes interference on the second optical signal which is extremely difficult to filter out at the receiver. This causes optical crosstalk between the laser and the photodetector which degrades the performance of the diplex transceiver, in particular the sensitivity of the photodetector.

Electrical crosstalk also occurs between the laser and the photodetector because they are close together and are excited by alternating current.

An aim of the invention is to propose a semiconductor diplex transceiver that does not have the drawbacks mentioned above.

Another object of the invention is to propose a semiconductor diplex transceiver which is simple to implement, of low cost and offers performance suitable for consumer grade applications in user premises optical fiber transmit/receive equipment, in particular its S/N ratio of the receive function.

SUMMARY OF THE INVENTION

To this end, the invention consists in a semiconductor diplex transceiver comprising means for generating a first optical signal having a certain wavelength and means for detecting a second optical signal having another wavelength, said generator means and said detector means forming integral parts of an optical waveguide adapted to propagate said first and second optical signals and being disposed in an inline configuration along a longitudinal axis of said optical waveguide, wherein said generator means generate said first optical signal in the form of a continuous wave and are disposed in an inline configuration along said longitudinal axis between said detector means and means for selectively modulating said first optical signal forming an integral part of said optical waveguide.

Unlike the device disclosed in document GB 2,243,720, among others, the first optical signal is modulated outside the generator means with the result that the part of the unmodulated first optical signal that is received by the detector means can easily be filtered to separate it from the second optical signal in order to avoid the problems of optical crosstalk between the transmit and receive functions.

The part of the first optical signal that reaches the detector means can be considerably reduced if a wavelength selective absorber that is selective at the wavelength of the first optical signal is provided between the generator means and the detector means.

Because the generator means must produce a continuous optical signal, it can be excited by a constant electrical potential, like the absorber and the detector means, which reduces electrical leakage between the transmit function and the receive function.

The features of the device in accordance with the invention contribute to obtaining an integrated inline structure along the longitudinal axis of the optical waveguide and independent of the polarization of the light that passes through this structure.

The generator means of the invention advantageously include a DFB, distributed Bragg reflector or Fabry-Perot type laser that is easy to implement on a semiconductor material structure.

The combination of a laser emitting continuously and a modulator external to the laser produces highly unidirectional modulated light (first optical signal), i.e. light that does not propagate in the optical waveguide towards the detector. In this way a semiconductor diplex transceiver can be obtained in which the receive function has the sensitivity required for a consumer grade application.

Other features and advantages will emerge further from a reading of the following description of one embodiment of the semiconductor diplex transceiver of the invention.

DETAILED DESCRIPTION OF THE PREFERRED EMBODIMENT

The diplex transceiver of the invention is implemented in the form of an integrated photonic monolithic component. In particular, the optical signal generator and the optical signal detector are individually integrated in an inline configuration into a semiconductor material layer acting as a linear optical waveguide.

The length of the diplex transceiver of the invention along a longitudinal axis of the waveguide is approximately 800 µm to 1,000 µm.

This optical waveguide is adapted to propagate optical signals at a first wavelength in one direction along the longitudinal axis of the waveguide and optical signals at a second wavelength different than the first wavelength in the other direction. In this example, the generator emits optical signals having a wavelength of 1.3 µm and the detector receives optical signals having a wavelength of 1.55 µm.

Figure 1:
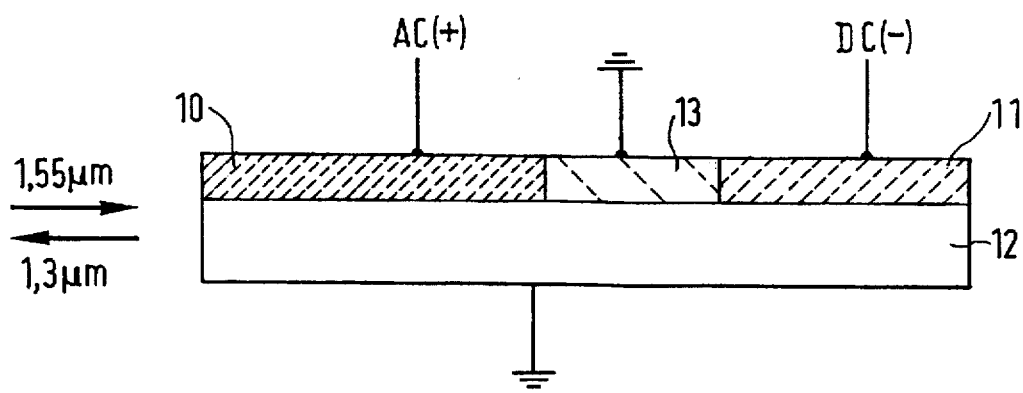
FIG. 1 is a diagram showing a prior art semiconductor diplex transceiver.
Figure 2:
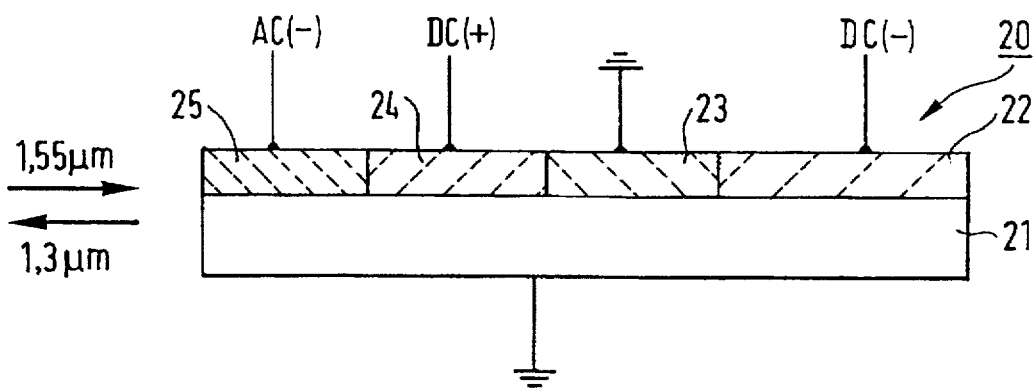
FIG. 2 is a diagram showing a semiconductor diplex transceiver of the invention.

FIG. 2 shows the semiconductor diplex transceiver 20 highly schematically. It includes in succession along the longitudinal axis of the optical waveguide 21: a photodetector 22 that is sensitive to optical signals at a first wavelength (1.55 µm in this example), an absorber 23 that is selective for optical signals at a certain wavelength (1.3 µm in this example), a generator 24 of optical signals at the second wavelength and a modulator 25 that is selective for optical signals at the second wavelength.

In accordance with the invention, the generator 24 includes a DFB laser, a distributed Bragg reflector laser or a Fabry-Perot laser.

The generator has the special feature of transmitting optical signals in the form of a continuous wave, i.e. unmodulated signals, these signals constituting for the wavelength selective modulator 25 which can easily be separated from the optical signals that must be detected by the photodetector 22.

In accordance with the invention, the laser generator 24 is excited by a constant potential DC(+), like the selective absorber 23 (which is grounded in this example) and the photodetector (negative biased by the signal DC(−)), which helps to reduce electrical leakage between the transmit function and the detection function, all the more so in that the two components that can interfere optically and electrically are the components farthest apart on the longitudinal axis of the waveguide.

Accordingly, as seen in FIG. 2, the modulator 25, which is at one end of the waveguide, receives an alternating reverse voltage AC(−) to modulate the optical signal at the second wavelength and the photodetector 22, which is at the other end of the waveguide, provides a current modulated by the signal received at the first wavelength with a constant reverse bias DC(−).

Note that the modulator 25 and the photodetector 22 of the invention operate at bit rates of approximately 600 Mbit/s in the transmit and receive directions.

Figure 3:
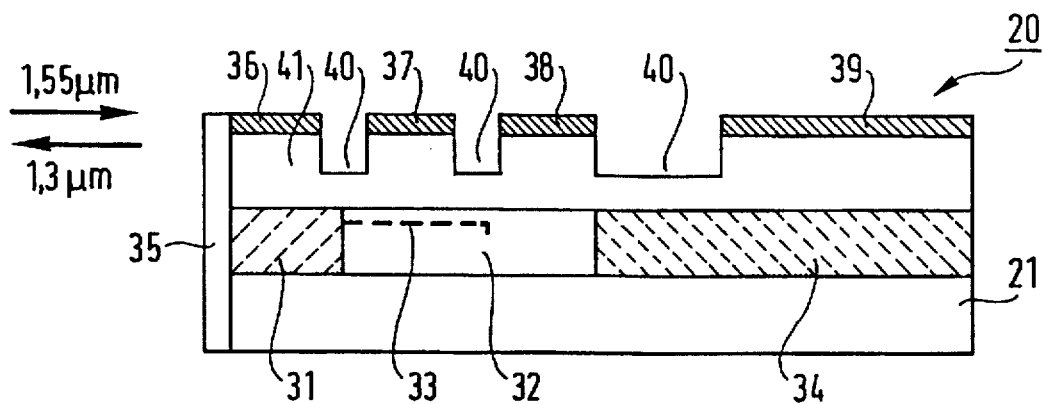
FIG. 3 shows the components of the device shown in FIG. 2 in more detail.

In FIG. 3 the parts of the monolithic component constituting the diplex transceiver 20 of the invention are shown in more detail.

The active part of the optical waveguide 21 comprises an area 31 that is electro-absorbent at 1.25 µm to modulate the optical signal at the wavelength of 1.3 µm leaving the diplex transceiver, this area 31 being transparent to the optical signal at the wavelength of 1.55 µm which enters the diplex transceiver. The area 31 is followed by a 1.3 µm quaternary composition (InGaAsP, for example) area 32 which is part of the DFB laser whose distributed grating 33 is shown in dashed line. The area 32 is followed by a 1.25 µm quaternary composition area 34 which is part of the detector.

The front face of the diplex transceiver 20 is covered with an anti-reflection dielectric layer 35.

The electrodes of the modulator, the generator of the absorber and the detector, 36, 37, 38, 39, respectively, are electrically isolated from each other by etched gaps 40 in a stripe 41 deposited on the waveguide 21. A 1.65 µm ternary composition absorbent layer is deposited between the electrode 39 and the area 34, with the result that this region operates as a photodetector at the wavelength of 1.55 µm.

The active area of the waveguide 21 is deposited onto an InP substrate with an electrode (not shown) connected to ground.

The diplex transceiver 20 of the invention is designed to be part of the equipment installed on the user's premises and connected by optical fiber to a transmit/receive station of an optical signal communication system.

There is claimed:

1. Semiconductor diplex transceiver comprising means for generating a first optical signal having a certain wavelength and means for detecting a second optical signal having another wavelength, said generator means and said detector means forming integral parts of an optical waveguide adapted to propagate said first and second optical signals and being disposed in an inline configuration along a longitudinal axis of said optical waveguide, wherein said generator means generate said first optical signal in the form of a continuous wave and are disposed in an inline configuration along said longitudinal axis between said detector means and means for selectively modulating said first optical signal forming an integral part of said optical waveguide.

2. Device according to claim 1 further comprising means for absorbing a part of said first optical signal that is propagated towards said detector means, said absorber means being disposed in an inline configuration along said longitudinal axis between said generator means and said detector means.

3. Device according to claim 2 wherein said generator means and said absorber means are excited by a constant potential.

4. Device according to claim 3 wherein said generator means include a DFB laser.

5. Device according to claim 3 wherein said generator means include a distributed Bragg reflector laser.

6. Device according to claim 3 wherein said generator means include a Fabry-Perot laser.

7. Device according to claim 3 wherein said certain wavelength is 1.3 μm and said other wavelength is 1.55 μ.

8. A semiconductor diplex transceiver having an in-line integral waveguide configuration, comprising transmitter means for modulating a first optical signal at a predetermined first wavelength and detector means for receiving, through said transmitter means, and then detecting a second optical signal having a second wavelength, said transmitter means comprising:

generator means for generating a continuous wave which includes said first wavelength; and modulator means for separately modulating said continuous wave so as to form said first optical signal at said first wavelength;

wherein said generator means is disposed between said modulator means and said detector means in said in-line integral waveguide configuration.

9. The device according to claim 8, further comprising means for absorbing a part of said first optical signal that is propagated towards said detector means, said absorber means being disposed in said in-line integral waveguide configuration.

10. The device according to claim 9 wherein said generator means and said absorber means are excited by respective constant potentials.

11. The device according to claim 10 wherein said generator means include a DFB laser.

12. The device according to claim 10 wherein said generator means include a distributed Bragg reflector laser.

13. The device according to claim 10 wherein said generator means include a Fabry-Perot laser.

14. The device according to claim 10 wherein said first wavelength is 1.3 μm and said second wavelength is 1.55 μm.

* * * * *